United States Patent [19]

Pietruszynski et al.

[11] Patent Number: 5,751,179
[45] Date of Patent: May 12, 1998

[54] OUTPUT DRIVER FOR PCI BUS

[75] Inventors: David Michael Pietruszynski; James Dub Austin; Brian Kirkland, all of Austin, Tex.

[73] Assignee: Crystal Semiconductor, Austin, Tex.

[21] Appl. No.: 639,369

[22] Filed: Apr. 26, 1996

[51] Int. Cl.$^6$ .................................................. H03K 17/16
[52] U.S. Cl. ...................... 327/379; 327/109; 327/309; 327/333
[58] Field of Search ............................ 327/108, 109, 327/309, 333, 379

[56] References Cited

U.S. PATENT DOCUMENTS

| | | | |
|---|---|---|---|
| 5,144,165 | 9/1992 | Dhong et al. | 307/451 |
| 5,151,619 | 9/1992 | Austin et al. | 307/473 |
| 5,160,855 | 11/1992 | Dobberpuhl | 307/270 |
| 5,206,544 | 4/1993 | Chen et al. | 307/443 |
| 5,243,236 | 9/1993 | McDaniel | 307/443 |
| 5,304,872 | 4/1994 | Avraham et al. | 307/475 |
| 5,341,045 | 8/1994 | Almulla | 327/333 |
| 5,381,059 | 1/1995 | Douglas | 326/58 |
| 5,418,476 | 5/1995 | Strauss | 326/58 |
| 5,444,401 | 8/1995 | Crafts | 327/108 |
| 5,525,926 | 6/1996 | Merritt | 327/108 |

OTHER PUBLICATIONS

IBM Technical Disclosure Bulletin, "Performance-Controlled CMOS Driver for Multi-Voltage Interfaces", vol. 33, No. 3A, pp. 445-446, Aug. 1990.

Primary Examiner—Margaret Rose Wambach
Attorney, Agent, or Firm—Gregory M. Howison; J. P. Violette

[57] ABSTRACT

An output driver is provided for operating in a primary power supply environment to drive an output system that can have voltages associated therewith that are higher than the primary power supply level. The driver includes a pull-down N-channel (34) and a pull-up P-channel transistor (44). An output node (40) is driven by the transistor (34) and (44). An N-channel protection device (38) is disposed between node (40) and transistor (34) and an N-channel transistor (48) is disposed between node (40) and transistor (44). Transistor (38) has the gate thereof biased to the primary supply voltage level and the transistor (48) has the gate thereof biased to a voltage slightly above the primary supply voltage level. This configuration allows a common control signal varying up to the primary power supply level utilized to drive both transistors (34) and (44) and also to remove the requirement that any of the wells associated with the driver transistors be biased to a voltage above the primary supply voltage level, to prevent current being conducted to the primary supply from the output node during a high voltage condition or for the voltage of any of the transistors to exceed a voltage slightly above that of the primary voltage supply level.

15 Claims, 2 Drawing Sheets

OUTPUT DRIVER FOR PCI BUS

TECHNICAL FIELD OF THE INVENTION

The present invention pertains in general to integrated circuits with output drivers that are utilized in conjunction with a PCI bus, and more particularly, to an output driver that can operate to drive a PCI bus at a lower than maximum voltage and still operate when the maximum voltage is applied to the output of the driver.

BACKGROUND OF THE INVENTION

In certain systems, there are standard voltages that are specified by a given system, one of these being the PCI bus standard. The PCI bus standard requires that a minimum voltage level of 2.4 volts exist on the bus to identify a high transition, the timing of the transition from a "0" voltage level to at least a level of 2.4 volts also being specified. This is a reflective wave bus system, such that the reflected pulse could be as high as 5.0 volts, the maximum voltage on the bus. Typically, there are a large number of input buffers/ output drivers that can be disposed on the bus. Therefore, each driver must be capable of generating a driving voltage of at least 2.4 volts but both input buffers/output drivers must also be able to withstand the full voltage level on the bus, i.e., 5.0 volts.

Since only a voltage level of 2.4 volts is required to be output, it is advantageous to utilize circuitry that operates at lower voltages and to drive the PCI bus from a lower voltage source. However, this circuitry must be able to accommodate the higher voltages on the bus without degrading the operation of the devices associated with the circuitry. As CMOS technology line widths have decreased, active devices are no longer able to sustain electric fields common in a 5 volt power supply environment. This is due to a number of effects, One known as the "hot carrier effect". If enough hot carriers are generated by the electric field in the channel of a transistor, some of the carriers can be injected into the device oxide where they are trapped. The observable effect is a change in the threshold voltage of the device over time, i.e., a degradation. To counter this effect, most sub-half micron CMOS technologies utilize a 3.3 voltage supply or lower. Unfortunately, these low voltage technologies must co-exist with the higher 5 volt technologies. To accommodate this, most system boards provide both 5 volt and 3 volt supplies and they will require 3 volt technologies to drive and receive 5 volt signals. In order to accommodate the two technologies in the same system, an interface of some type must be provided which interfaces between 3.3 volt logic on-chip and an off-chip 5 volt bus. Gate oxides may also break down under voltage stress which will destroy the MOS transistor operation.

If a pull-up P-channel transistor and a pull-down N-channel transistor are utilized in a typical driver, a problem exists when the high bus voltage on the output exceeds the on-chip $V_{DD}$ by more than a diode drop, the PN junction of the P-channel transistor will forward bias. Even if this forward bias were prevented, possibly by using an N-channel pull-up transistor, the bus voltage may cause the gate-to-drain voltage of the pull-down transistor to exceed the reliability limits by the hot carrier effect. This results in two problems, the first being excessive current dumped into the substrate and, second, excessive gate-to-drain or gate-to-source voltage creating hot carriers.

SUMMARY OF THE INVENTION

The present invention disclosed and claimed herein comprises a driver circuit for driving an external system from a primary power supply, which external system can have voltages associated therewith at a second and substantially higher voltage than the primary voltage supply. An output node is provided which is connectable to the external system. A primary power supply rail and a ground rail are provided, with the primary power supply rail disposed at the primary power supply level. A pull-up transistor is provided for driving the output node from the primary power supply node, the gate of the pull-up transistor connected to a driving signal. A pull-down transistor is provided for sinking current from the output node to the ground rail, the gate of the pull-down transistor connected to the driving signal. A first protection transistor is disposed between the pull-up transistor and the output node, with the gate connected to a bias voltage. The first protection transistor is operable to prevent current from flowing through the first protection transistor to the pull-up transistor and therethrough to the primary power supply. The pull-down transistor and the first protection transistor are fabricated from the same semi-conductor type material and the pull-up transistor is fabricated from a second and opposite type conductivity material.

In another aspect of the present invention, a second protection transistor is provided which is disposed between the output node and the pull-down transistor, the gate of the second protection transistor connected to a bias voltage. The pull-up transistor, pull-down transistor, first protection transistor and second protection transistor are fabricated from transistors that have parameters which will degrade if the voltage across the gate-to-source or gate-to-drain thereof exceeds a tolerable voltage level. The voltage disposed on the gate of the first protection transistor and the voltage disposed on the gate of the second protection transistor, is such that the difference between either of the voltages on the respective gates of the first and second protection transistors and the second voltage level is less than the tolerable voltage level.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
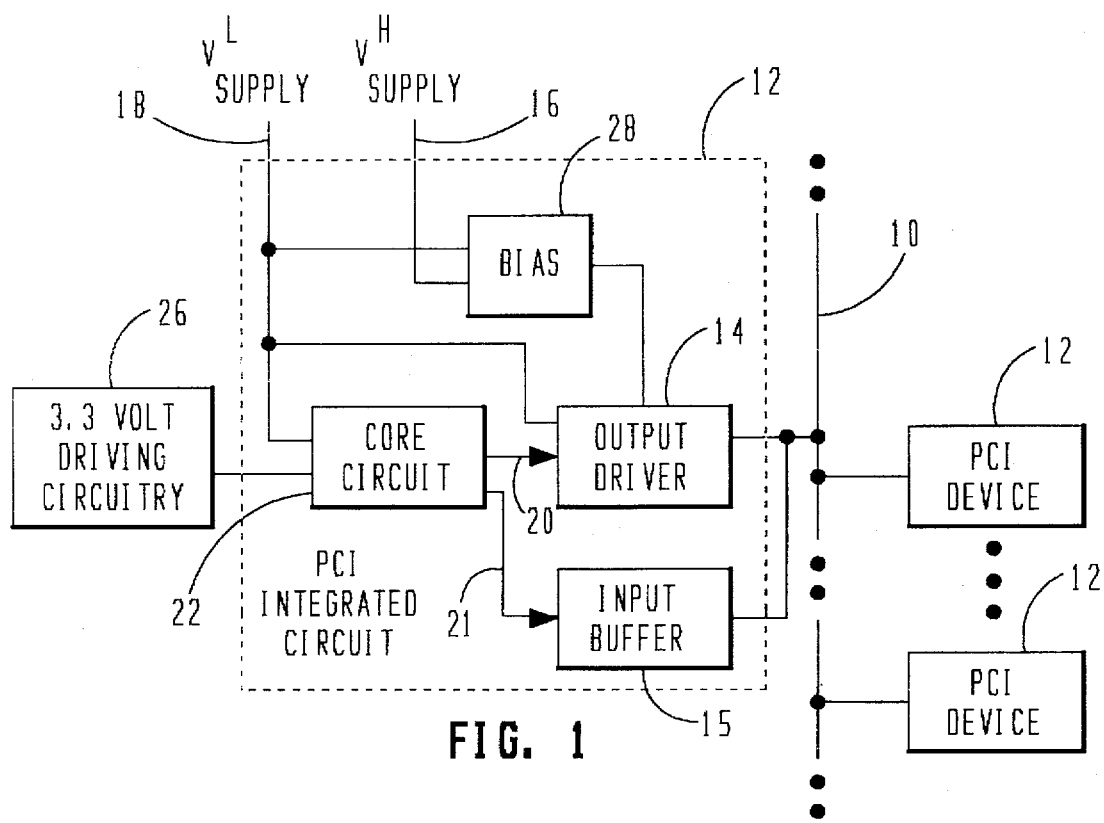
FIG. 1 illustrates an overall system diagram illustrating the use of an integrated circuit with the output driver in a conventional PCI bus system.

Referring now to FIG. 1, there is illustrated a block diagram of a PCI bus 10 and various PCI devices 12 associated therewith. One of these PCI devices 12 is illustrated in detail, this referred to as a PCI integrated circuit. The PCI integrated circuit includes an output driver 14. The output driver 14 is connected to the PCI bus 10 and is operable to drive the PCI bus 10 with a DC voltage of at least 2.4 volts. However, the output driver 14 is also able to sustain the full 5 volt level of the PCI bus 10, this being described in more detail hereinbelow. An input buffer 15 is provided for being connected to receive signals from the PCI bus 10 under the same voltage conditions as the output driver 14.

The output driver 14 is a 3.3 volt device. There are two voltages associated with the illustrated system, a 3.3 volt level and 5.0 volt level. The PCI device 12 has associated therewith a first supply input 16 for the 5.0 volt supply level and second supply input 18 for the 3.3 volt supply. The output driver 14 is operable to receive on an input 20, a 3.3 volt driving signal that varies between 0 volts and 3.3 volts. This is generated in core circuitry 22, which core circuitry 22 is any type of combinatorial logic. The core circuitry also receives on a line 21 the output of the input buffer 15. This core circuitry 22 operates on the 3.3 volt supply level received on line 18 and is also able to interface with external 3.3 volt driving circuitry 26. A bias circuit 28 is provided for providing bias to the output driver 14 and referenced to the 5 volt supply, as will be described in more detail hereinbelow.

Figure 2:
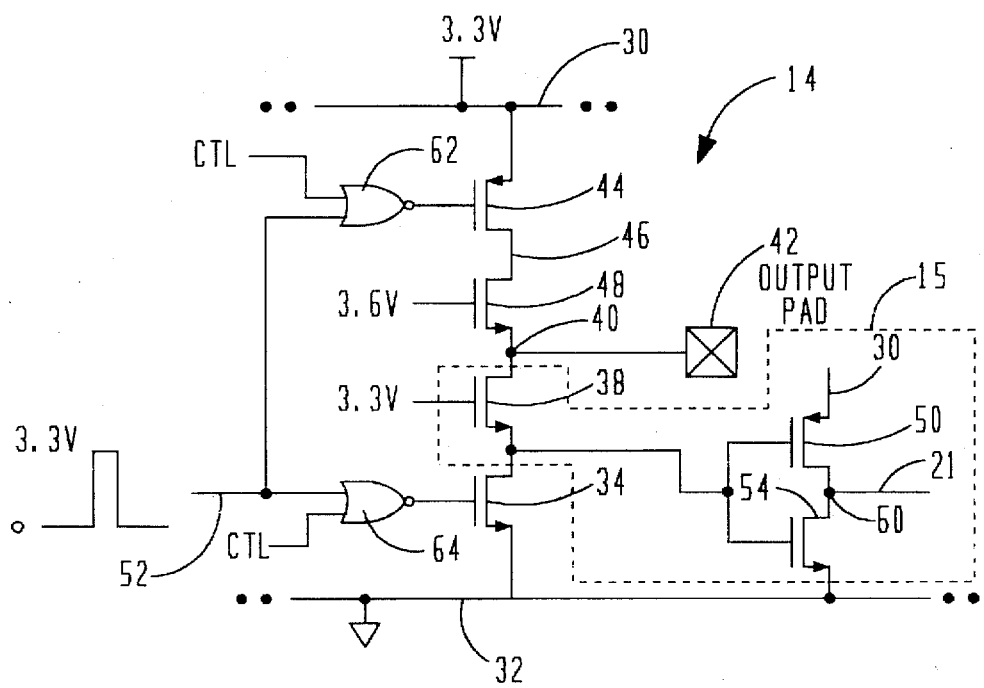
FIG. 2 illustrates a detailed schematic of the output driver of the present invention.

Referring now to FIG. 2, there is illustrated a detailed schematic of the output driver 14. The output driver 14 is disposed between two power supply rails, a 3.3 volt rail 30 and a ground rail 32. An N-channel transistor 34 has the source/drain path thereof disposed between the ground rail 32 and a node 36. A second N-channel transistor 38 has the source/drain path thereof connected between an output node 40 and the node 36, the output node 40 connected to an output pad 42, the output pad 42 interfaced with the PCI bus 10. The gate of transistor 38 is connected to the on-chip supply voltage of 3.3 volts. The transistors 34 and 38 comprise the pull-down portion of the output driver. The pull-up portion of the output driver is comprised of a P-channel transistor 44 having the source/drain path thereof connected between the positive supply rail 30 and a node 46, and an N-channel transistor 48 having the source/drain path thereof connected between the node 4 and the output node 46.

The gate of N-channel transistor 34 is connected to the output of an NOR gate 64, one input thereof connected to a CTL-Bar control signal and the other input thereof connected to an input signal line 52 that varies between zero volts and 3.3 volts. This is the on-chip logic level. This is provided by the on-chip power supply. Similarly, the gate of transistor 44 is connected to the output of a NAND gate 62, one input thereof connected to the input line 52 and the other input thereof connected to the CTL control signal. In operation, when the CTL signal is high and the CTL-Bar signal is low, both NAND gate 62 and NOR gate 64 are enabled, wherein a "zero" on line 52 will turn on transistor 44 and turn off transistor 34, and a "high" on line 52 will turn off transistor 44 and turn on transistor 34. Whenever the CTL signal is low and the CTL-Bar signal is high, this will place the input in a three-state mode, turning off both transistors 34 and 44.

The transistors 34, 38, 48 and 44 are manufactured such that they will undergo degradation due to hot carrier effects if the gate-to-source voltage exceeds 3.6 volts. Since the normal driving voltage to the gate of transistor 34 is a maximum of 3.3 volts, normal operating conditions will not result in excessive voltage being disposed across the gate oxide of transistor 34. However, voltages up to 5.0 volts can exist on node 40. Transistor 38 acts to protect transistor 34 from voltages of this level, as transistor 38 will pull node 36 up to only one threshold below the 3.3 volt power supply whenever node 40 is greater than one threshold below the 3.3 volt supply. Once transistor 38 is turned off, the voltage of node 40 is isolated from node 36 and the voltage across the gate oxide of transistor 38 will then only be the difference between the voltage on node 40 and the voltage on the gate of transistor 38, i.e., 1.7 volts. This is well within the tolerable voltage of the transistor 38. It is important to note that the gate of transistor 48 cannot be biased at a level above 3.6 volts, since, when driven, the voltage on node 40 will be pulled to ground or, virtually to ground accounting for the voltage drop across transistors 38 and 34 when in a conducting state. However, the voltage is substantially 3.6 volts across the gate oxide layer of transistor 48. Similarly, the voltage drop across the gate oxide layer of transistor 38 is approximately 3.3 volts. It should also be noted that the gate of transistor 38 could be connected to the gate of transistor 48 and the corresponding voltage thereon.

The N-channel transistor 48 is operable to protect the P-channel transistor 44 in the event that a voltage is disposed on the output node 40 that is greater than the voltage on the supply rail 30, i.e., a 5.0 volt level on node 40 exceeding the 3.3 volt level on power supply rail 30. When node 40 rises to a level that is above 3.6 minus the $V_T$ of the transistor 48, transistor 48 will turn off. When the voltage rises to 5.0 volts, the difference between the voltage on node 40 and the gate voltage of 3.6 volts is 1.4 volts, well within the tolerable limits of transistor 48, such that no overstress will be applied to the gate oxide of transistor 48. It is noted that the highest voltage on the PCI bus is actually around 5.7 Volts, due to the fact that somewhere in the system there is a diode that is reversed biased during normal operating conditions and will conduct during overvoltage conditions to prevent the voltage from rising more than one diode drop above the 5.0 Volt power supply level.

When the output driver 14 is driving the output node 40 and a low voltage is on node 52, transistor 44 will turn on and transistor 48 will conduct, with transistor 34 being turned off. This will cause node 40 to rise. The output node 40 will be driven to a level that is equal to one threshold voltage below the gate voltage of transistor 48 of 3.6 volts minus the $V_T$ of transistor 48. Since the threshold voltage of transistor 48 is slightly greater than that associated with a transistor having the source thereof connected to ground, i.e., as is transistor 34, then the gate voltage of transistor 48 must be slightly higher than the actual 3.3 volt level, in order to insure that the output voltage provided on node 40 during a driving operation is at least 2.4 volts. This is achieved through the use of a voltage translation device, which is conventional.

By protecting the P-channel transistor 44 with an N-channel transistor 48, the transistor 48 can be disposed in the same substrate material as the transistors 38 and 34. If, however, a P-channel transistor were utilized in place of the transistor N-channel 48, the well in which the P-channel transistor were disposed would have to be biased at the highest voltage level that the node 40 would go to, i.e., 5 volts, or it would have to be a dynamically floating well. Otherwise, the PNP structure formed by the two P-channel pull-up transistors in the common well would conduct current back into the 3.3 volt power supply, an undesirable situation. However, if the common N-well associated with the P-channel pull-up transistors were biased at 5.0 volts, this would require level shifting of the control signal. With the present configuration described hereinabove with respect to the present invention, no level switching is required for the control signal that drives the pull-up P-channel transistor 44 and the pull-down transistor 34. By utilizing an N-channel transistor to protect the pull-down transistor 34 and an N-channel transistor 48 to protect the P-channel pull-up transistor 44, over voltage protection is provided for both control transistors without requiring any level shifting and also allowing use of lower voltage transistors, i.e., transistors that have a rated gate-to-source voltage less than the maximum voltage.

The input buffer 15 is comprised of a series-connected P-channel transistor 50 and an N-channel transistor 54, which P-channel transistor 50 has the source/drain path thereof connected between the 3.3 volt power supply rail 30 and an output node 60 connected to line 21. The N-channel transistor 54 has the source/drain path thereof connected between node 60 and the ground power supply rail 32. The gates of transistors 50 and 54 are connected together and to node 36. The transistor 38 also forms a portion of the input buffer 15.

In operation, the transistor 38 is a protection device that is operable to protect the transistor 54 from being subjected to voltages above 3.6 volts across its oxide. It is important to note that the protection device 38 operates as both the "gate" for the input device and the protection device for both the input and output buffers to minimize the device count. Therefore, when the voltage on output path 42 rises to a voltage of 5.0 volts, the voltage across the oxide of transistor 38 will be the difference between the voltage on output path 42 and the gate voltage of transistor 38, i.e., 1.7 volts, and the voltage on node 36 will be one threshold voltage below the gate voltage of node 38.

A P-channel transistor 55 has the source-to-drain path thereof connected between the gates of transistors 50 and 54 and the 3.3 Volt supply on rail 30. The gate of transistor 55 is connected to the terminal 21. Transistor 55 is operable to latch the full signal to the input buffer 15. A P-channel transistor 57 has the source-to-drain path thereof connected between the terminal 21 and the rail 30, and the gate thereof connected to a DISABLE-Bar signal to allow the input buffer 15 to be disabled.

Figure 3:
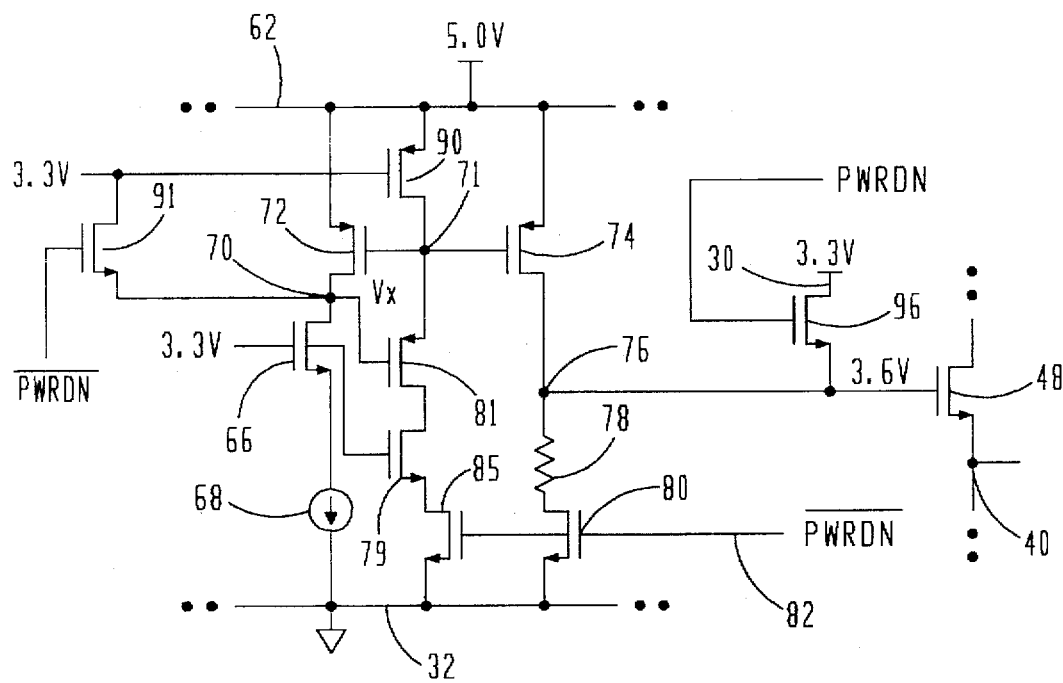
FIG. 3 illustrates a detailed schematic of a bias circuit for biasing the N-channel protection transistor.

Referring now to FIG. 3, there is illustrated a detailed schematic diagram of the bias circuitry for transistor 48 and also the power down circuitry. In general, the bias cell is required to generate a 3.6 volt signal that is to be applied to the gate of the transistor 48 for each driver. The general core logic operates off a 3.3 volt supply and there are only two methods to obtain a 3.6 volt signal that is referenced to this 3.3 volt source. One method is to utilize a voltage doubler or a boost circuit and the second is to bring the 5 volt supply onto the chip and utilize it to obtain the 3.6 volt signal referenced to the 3.3 volt signal. Although the first method will work, the second is the method used in the preferred embodiment.

Although not shown, a band gap generator is provided on the chip that operates at a 3.3 volt level and provides a temperature independent voltage (VBG=VBE(ON)+KVT which is the temperature independent voltage). The voltage VBG is divided by a resistor $R_B$ to provide a current VBG/$R_B$. This current is utilized to control current through a second resistor R to obtain a voltage of 3.6 volts. Since the band gap voltage VBG is a temperature independent voltage, it can be seen that the current VBG/$R_B$ will vary inversely proportional to temperature according to the temperature co-efficient of $R_B$. This current, as will be described hereinbelow, will then be dropped across resistor R, the temperature coefficients of $R_B$ and R will cancel, and it is possible to achieve a temperature independent voltage of 3.6 volts according to the relationship:

$$V_{OUT} = 3.6\ v = VBG \times \frac{R}{R_B}$$

With further reference to FIG. 3, there are provided five diode connected P-channel transistors 66, 67, 68, 69 and 70 connected between a positive 5 volt rail 72 and ground. Each of the diode connected transistors 66–70 is contained within its own well. The voltage across each diode configured transistor 66–70 will be approximately ⅕ of the 5 volt supply across all corners, since the P-channels track each other. The voltage at the top of the third diode connected transistor 68 relative to ground is tapped off and used as an input to the gate of two N-channel transistors 74 and 76. This voltage will be approximately ⅗ of the 5 volt supply. Thus, transistors 74 and 76 are protection transistors which will prevent any transistor below them or above them from violating the 3.6 volt rule mentioned above.

The current VBG/$R_B$ drive from the band gap voltage VBG connected across resistor $R_B$ (not shown) is represented by a current source 77 disposed between the source/drain path of transistor 76 and ground. The other side of the source/drain path of transistor 76 is connected to one side of the source/drain path of a P-channel transistor 78, the other side of the source/drain path of transistor 78 connected to the rail 72 and the gate of transistor 78 connected to the connection between transistor 76 and 78. The gate of transistor 78 is connected to the gate of a P-channel transistor 79, the source/drain path thereof connected between the rail 72 and a node 80, which is connected to the gate of transistor 48. Node 80 is connected to ground through two series connected resistors 81 and 83 and the source/drain path of an N-channel transistor 84. The gate of transistor 84 is connected to a power down signal PWDN-Bar. Therefore, transistor 79 is operable to mirror the current through current source 77 through the resistors 81 and 83 with transistor 84, when conducting. Resistor 81 and resistor 83 are summed to provide the value R, with resistor 81 being a value of ⅔R and the resistor 83 being a value of ⅓R. The ratio of $R_B$ and R are scaled appropriately to achieve a 3.6 level at $V_{OUT}$.

Transistor 74 has a current source 85 connected between one side of the source/drain path thereof and ground. Current source 85 is derived from the band gap voltage (not shown) that is divided by a resistor $R_p$ (not shown). A resistor 87 is connected between the other side of the source/drain path of transistor 74 and positive voltage rail 72. The connection between the resistor 87 and the other side of the source/drain path of transistor 74 comprises a node 88. Node 88 is connected to the gate of two series connected transistors, a P-channel transistor 89 and an N-channel transistor 90. Transistor 89 has one side of the source/drain path thereof connected to the rail 72 and the other side thereof connected to one side of the source/drain path of transistor 90. The other side of the source/drain path of transistor 90 is connected to the gate of transistors 74 and 76, with the well of transistor 90 connected to ground and the well of transistor 89 connected to the positive rail 72. The connection between transistors 89 and 90 is connected to the gate of a P-channel transistor 91, the source/drain path thereof connected between the positive rail 72 and the gates of transistors 78 and 79.

The result of transistor 74 and current source 85 is that transistor 89 will be turned on and transistor 90 will be turned off. Transistor 89 will pull the gate of transistor 91 to the 5 volt supply, thereby turning transistor 91 off. This is the normal operation condition.

In the power down mode, the circuit is required to draw as little current as possible and still drive the output voltage on node 80 to an acceptable level. In the power down mode, both of the currents in the band gap generator, VBG/$R_B$ and 2.0v/$R_p$ are shut off. Thus, no current will be sunk through current sources 77 and 85. This will cause transistor 89 to turn off and transistor 90 to turn on. Transistor 90 will pull the gate of transistor 91 to a voltage that is approximately ⅗ of the 5 volt supply on the rail 72 through the diode string which is still biased, since it is not connected to the band gap generator. This will turn on transistor 91, which will pull the gates of transistors 78 and 79 to the 5 volt supply rail 72, since there is no current being sunk through transistor 78. This will shut transistor 78 and transistor 79 off. This will cut the path off from the node 80 and the power supply 72.

In the power down condition, the PWDN-Bar signal will be high (3.3 volts) and thus, transistor 84 will be turned off. This will cut the path off from the node 80 to ground. The voltage on node 80 will now be pulled to approximately ⅗ of the 5 volt supply through a transistor 94 that has the source/drain path thereof connected between the junction between resistors 81 and 83 and the gates of transistors 74 and 76, and the gate of transistor 94 connected to the PWDN signal. Since the voltage on node 80 goes to the gates of the N-channel pull-ups in the drivers (transistor 48), it can be seen, even in the power down mode, that the gates of these transistors 48 are driven to an acceptable voltage level.

Figure 4:
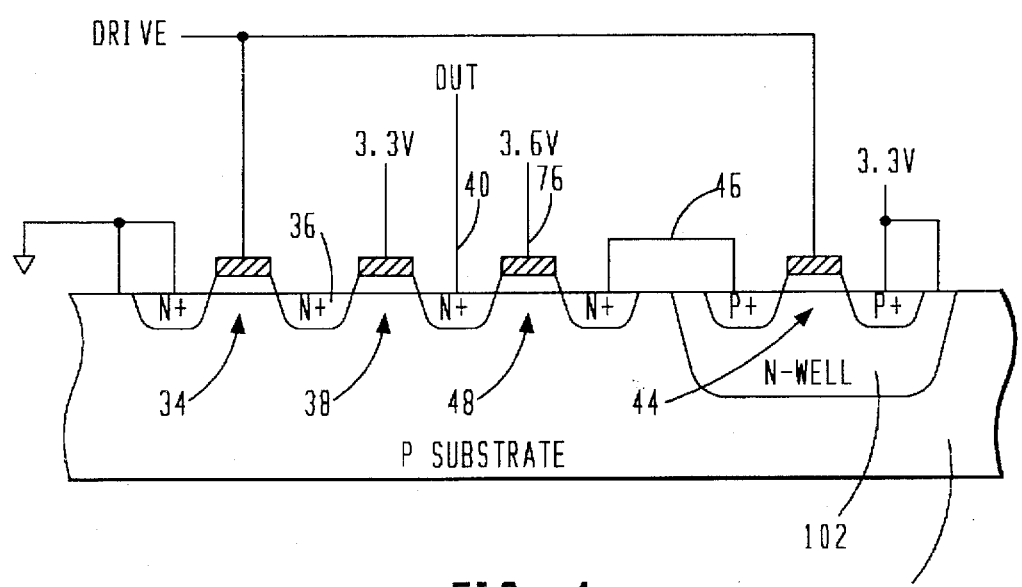
FIG. 4 illustrates a cross sectional view of the semiconductor structure illustrating the arrangement of the transistors in the output driver of the present invention.

Referring now to FIG. 4, there is illustrated a simplified layout for the output driver of FIG. 2. It can be seen that the transistors 34, 38, 48 and 44 are all formed in a P-type substrate 100. Of course, only N-channel transistors can be formed in the substrate by forming N+ semiconductor regions for the source/drain regions and separated by a gate oxide layer in a gate electrode. The P-channel transistor 44 is formed in an N-well 102, which is biased to the 3.3 volt level. It can be seen that when a 5.0 voltage level is disposed on the output node 40, the N+ source/drain region disposed between transistors 38 and 48 will be reverse biased, since the P-substrate 100 is disposed at a ground voltage level. As long as the gate of transistor 48 is at a voltage that results in difference between the output voltage and the gate voltage of less than 3.6 volts, the stress across the gate oxide layer of transistor 48 will be less than 3.6 volts total. This is a similar case with respect to the transistor 38. Therefore, transistors 38 and 48 provide adequate blocking for over voltage conditions, due to the fabrication thereof and the voltage bias. It should be understood, however, that this is a structure that is formed in a P-substrate. It could be formed in an N-substrate with the inverse of the transistors utilized. That is, three P-channel transistors could be utilized and one N-channel transistor. This would require inverse voltages but substantially the same benefits are realized with the present invention.

In summary, there has been provided an output driver for operating at a first voltage supply level to drive an output bus that can have voltage signals that are substantially greater than the voltage supply level of the driver. The driver includes an N-channel pull-down transistor and a P-channel pull-up transistor, both driven from a single control signal that varies between ground and the primary supply level of the driver. The N-channel pull-down transistor and the P-channel pull-up transistor are protected by N-channel transistors disposed between the respective pull-down and pull-up transistors and an output node. The transistors utilized to fabricate the output driver are such that they cannot withstand the full voltage level on the output bus. The protection devices are N-channel transistors that are biased at the power supply voltage level.

Although the preferred embodiment has been described in detail, it should be understood that various changes, substitutions and alterations can be made therein without departing from the spirit and scope of the invention as defined by the appended claims.

What is claimed is:

1. A driver circuit for driving an external system from a primary power supply, which external system can have voltages associated therewith at a second and substantially higher voltage than the primary power supply, comprising:

an output node connectable to the external system;

a primary power supply rail disposed at the primary power supply voltage level;

a ground rail disposed at a ground reference voltage level;

an output pull-up transistor for driving said output node from said primary power supply rail, the gate of said output pull-up transistor connected to a driving signal;

an output pull-down transistor for sinking current from said output node to said ground rail, the gate of said pull-down transistor connected to said driving signal;

a first protection transistor disposed between said output pull-up transistor and said output node for preventing current from flowing from said output node to said power supply rail through said output pull-up transistor when a voltage higher than the primary power supply voltage level is disposed on said output node and having the gate thereof connected to a first pre-determined bias voltage; and said output pull-down transistor and said first protection transistor fabricated from the same conductivity type material, and said output pull-up transistor fabricated from a second and opposite conductivity type material to said pull-down transistor.

2. The driver circuit of claim 1, wherein said output pull-down transistor is an N-type transistor and said output pull-up transistor is a P-type transistor.

3. The driver circuit of claim 1 and further comprising a second protection transistor disposed between said output node and said output pull-down transistor and having the gate thereof connected to a second pre-determined bias voltage.

4. The driver circuit of claim 3, wherein all of said output pull-up, output pull-down, first protection and second protection transistors are fabricated from transistors wherein disposal of a voltage level substantially equal to said second voltage will degrade the gate oxide thereof.

5. The driver circuit of claim 4, wherein said first protection transistor has the gate thereof disposed at a voltage level such that the difference between the gate voltage on said first protection transistor and said second voltage is less than the maximum voltage tolerable by said first protection transistor, such that the gate oxide of said output pull-up transistor is not subjected to an excessive voltage level outside the tolerances thereof when the gate of said output pull-up transistor is pulled to said ground rail voltage level by said driving signal.

6. The driver circuit of claim 4, wherein said second protection transistor has the gate thereof disposed at a voltage level such that the difference between the gate voltage on said second protection transistor and said second voltage is less than the maximum voltage tolerable by said second protection transistor, such that the gate oxide of said output pull-down transistor is not subjected to an excessive voltage level outside the tolerances thereof when the gate of said output pull-down transistor is pulled to said primary power supply rail voltage level by said driving signal.

7. The driver circuit of claim 5, and further comprising power down circuitry for detecting the presence of a power down signal, and in the presence of said power down signal, latching the gate of said first protection transistor to a third predetermined voltage such that the difference between said third predetermined voltage and said second voltage is less than said tolerable voltage.

8. The driver circuit of claim 3, and further comprising an input buffer, said input buffer having:
- an input pull-up transistor for sourcing current from said primary supply rail to an internal input node;
- an output pull-down transistor for sinking current from said internal input node to said ground rail; and
- the gates of said input pull-up transistor and said input pull-down transistor connected together and to the interconnection between said second protection transistor and said output pull-down transistor, said first protection transistor forming a portion of said input buffer.

9. A driver circuit for driving an external system from a primary power supply, which external system can have voltages associated therewith at a second and substantially higher voltage than the primary power supply, comprising:
- an output node connectable to the external system;
- a primary power supply rail disposed at the primary power supply voltage level;
- a ground rail disposed at a ground reference voltage level;
- an output pull-up transistor for driving said output node from said primary power supply rail: the gate of said output pull-up transistor connected to a driving signal;
- an output pull-down transistor for sinking current from said output node to said ground rail, the gate of said pull-down transistor connected to said driving signal;
- a first protection transistor disposed between said output pull-up transistor and said output node for preventing current from flowing from said output node to said power supply rail through said pull-up transistor when a voltage higher than the primary power supply voltage level is disposed on said output node and having the gate thereof connected to a first pre-determined bias voltage;
- said output pull-down transistor and said first protection transistor fabricated from the same conductivity type material, and said output pull-up transistor fabricated from a second and opposite conductivity type material to said pull-down transistor; and
- an input buffer, said input buffer having:
  - an input pull-up transistor for sourcing current from said primary supply rail to an internal input node,
  - an output pull-down transistor for sinking current from said internal input node to said ground rail, and
  - the gates of said input pull-up transistor and said input pull-down transistor connected together and to be interconnected between the side of said source/drain path not connected to said ground rail and said output pull-down transistor, said first protection transistor forming a portion of said input buffer.

10. The driver circuit of claim 9, wherein said output and input pull-down transistors are N-type transistors and said output and input pull-up transistors are P-type transistors.

11. The driver circuit of claim 9 and further comprising a second protection transistor disposed between said output node and said output pull-down transistor and having the gate thereof connected to a second pre-determined bias voltage.

12. The driver circuit of claim 11, wherein all of said output and input pull-up, output and input pull-down, first protection and second protection transistors are fabricated from transistors wherein disposal of a voltage level substantially equal to said second voltage will degrade the gate oxide thereof.

13. The driver circuit of claim 12, wherein said first protection transistor has the gate thereof disposed at a voltage level such that the difference between the gate voltage on said first protection transistor and said second voltage is less than the maximum voltage tolerable by said first protection transistor, such that the gate oxide of said output pull-up transistor is not subjected to an excessive voltage level outside the tolerances thereof when the gate of said output pull-up transistor is pulled to said ground rail voltage level by said driving signal.

14. The driver circuit of claim 12, wherein said second protection transistor has the gate thereof disposed at a voltage level such that the difference between the gate voltage on said second protection transistor and said second voltage is less than the maximum voltage tolerable by said second protection transistor, such that the gate oxide of said output pull-down transistor is not subjected to an excessive voltage level outside the tolerances thereof when the gate of said output pull-down transistor is pulled to said primary power supply rail voltage level by said driving signal.

15. The driver circuit of claim 13, and further comprising power down circuitry for detecting the presence of a power down signal, and in the presence of said power down signal, latching the gate of said first protection transistor to a third predetermined voltage such that the difference between said third predetermined voltage and said second voltage is less than said tolerable voltage.

* * * * *